United States Patent [19]

Grau

[11] 4,189,199
[45] Feb. 19, 1980

[54] ELECTRICAL SOCKET CONNECTOR CONSTRUCTION

[75] Inventor: Thomas G. Grau, Mendham Township, Morris County, N.J.

[73] Assignee: Bell Telephone Laboratories, Incorporated, Murray Hill, N.J.

[21] Appl. No.: 934,326

[22] Filed: Aug. 16, 1978

[51] Int. Cl.² .................... H01R 13/54; H05R 1/10
[52] U.S. Cl. .................... 339/75 MP; 339/17 CF; 339/91 R
[58] Field of Search ............ 339/75 R, 75 M, 75 MP, 339/91 R, 176 MP, 17 CF

[56] References Cited

U.S. PATENT DOCUMENTS

| | | | |
|---|---|---|---|
| 3,750,085 | 7/1973 | Cooper | 339/75 M |
| 3,820,054 | 6/1974 | Clewes et al. | 339/17 CF |
| 3,883,207 | 5/1975 | Tomkiewicz | 339/75 M |
| 3,953,101 | 4/1976 | Palecek | 339/17 CF X |
| 4,054,347 | 10/1977 | Movissie | 339/17 CF X |

OTHER PUBLICATIONS

"Wedge Activated Low Insertion Force Connector, R. T. Evans," IBM Technical Disclosure Bull., vol. 11, No. 11, p. 1443, Apr. 1969.

*Primary Examiner*—Eugene F. Desmond
*Attorney, Agent, or Firm*—William H. Kamstra

[57] ABSTRACT

An electrical socket connector construction for receiving the terminals of an electrical integrated circuit pack in which the body of the connector is formed in two steps. A housing (10) is initially molded in rectangular, box-like form, its base (15) initially being in two sections (20, 21) separated by a small gap (19). In a second step, the side walls (11, 12) are forced together to close the base (15) gap and are locked together by a latching mechanism (23, 24, 25, 26) at each end. The top wall (14) is buckled upward in the gap (19) closure along hinge lines (22) to form two peaked members (16, 17) each having a longitudinal slot (27) on the inside of the housing (10). Rows of apertures (18, 28) formed in the top wall and base (14, 15) admit the circuit pack (34) terminals (35, 36) in the top and fit two-bladed contact receptacles (29) in the base. One blade (31) of each row is extended to engage a slot (27) of the top members (16, 17) which, in their peaked stake, hold the blades (30, 31) open. As the terminals (35, 36) of an integrated circuit pack (34) are inserted therebetween, the body of the circuit pack (34) forces the peak juncture of the top wall (14) members (16, 17) downward beyond the horizontal in a "snap" action against the resilient spring action of the side walls (11, 12). As a result, the extended blade (31) of each contact receptacle (29) is forced against a clasped terminal (35, 36) for positive electrical contact and locked-in securing of the integrated circuit pack.

13 Claims, 4 Drawing Figures

ELECTRICAL SOCKET CONNECTOR CONSTRUCTION

TECHNICAL FIELD

This invention relates to electrical connector arrangements and particularly to such arrangements for providing an intermediary socket connection between modular circuit packs, such as a dual-in-line pack, for example, and printed wiring boards and the like.

BACKGROUND ART

The interconnection of individual circuit components and printed wiring boards, for example, has until recently been accomplished by the well-known method of soldering the component leads to the board wiring. Although effective electrical connections were thus achieved, the soldering operations were time consuming and, further, created connections which were more or less permanent. Replacement of a defective component, for example, necessitated the unsoldering of the defective component leads and the resoldering of the replacement leads thus adding to the cost of circuit maintenance and repair. This problem has been aggravated with the advent of large-scale integrated circuit packs, such as dual-inline packs, for example, having dual groups of many terminals. To meet the problem and obviate the necessity of soldering large numbers of terminals which are usually closely spaced and frequently small, socket connectors have been provided. Such connectors have contact receptacles into which the circuit pack terminals may be inserted, the connector contacts then being permanently soldered to the circuit wiring board. Although the socket connectors offer the obvious advantage of plug-in connection of the circuit packs and thereby facilitate component replacement, the connectors in turn present other problems.

The receptacle contacts of the socket connector generally comprise deflectable free cantilever beam springs which are urged against the circuit pack terminals by spring action after insertion of the terminals in the connector receptacles. The insertion of the terminals is accomplished against the spring action, which action must be sufficient to ensure positive electrical contact. When many circuit pack terminals are involved, which is typically the case, considerable force may be required to insert the many terminals in the corresponding receptacles of the connector. Since the terminals are small and fragile, the insertion force required leaves the terminals vulnerable to bending, misalignment, and other damage to the contact surfaces. The risk of damage, of course, is present on each replacement occasion and the exercise of considerable care has been required to ensure proper seating of the circuit pack terminals.

The foregoing insertion problem has led to the development of so-called zero insertion force connectors. In these connectors, the electrical contact forces on the circuit pack terminals are not fully applied until the terminals are completely or nearly completely inserted in their receptacles. Such a zero or low insertion force socket connector is disclosed, for example, in U.S. Pat. No. 3,883,207, of T. K. Tomkiewicz, issued May 13, 1975. Another prior art connector offering a low insertion force and embodying a unitary molded construction is disclosed in U.S. Pat. No. 3,820,054 of A. B. Clewes et al., issued June 25, 1974. Generally, zero or low insertion force connectors as typified by the examples cited have been more expensive than their conventional counterparts and have increased the cost of circuit pack mountings. A zero insertion force connector has generally been more complex and made up of a larger number of piece parts. As a result, more time was required for their fabrication. Also because of their complexity, zero insertion force connectors have been bulkier, thereby requiring a larger share of printed wiring board area.

SUMMARY OF THE INVENTION

Simplicity of fabrication and operation as well as reduced size are achieved by a zero insertion force socket connector construction according to the invention in which all of the operative elements (except the electrical contact springs) are integrally molded in a unitary housing. As molded, the housing presents a rectangular, box-like structure having parallel side walls, an initially flat top wall, and a two-section, initially separated base. The two sections of the base, running respectively parallel with the side walls, each has a row of slots dimensioned to receive the connector contact springs and spaced lengthwise to correspond with the spacings of the sets of terminals of the circuit pack to be mounted. The flat top of the housing thus formed is provided with corresponding rows of apertures aligned lengthwise to receive the latter terminals.

In accordance with the principles of this invention and as before-noted, the top of the molded housing is initially flat and the split base sections are initially separated by a small gap. As a result of this separation, the rows of apertures in the housing top as well as the rows of slots in the two base sections are spaced apart a distance greater by the amount of the separation gap than the distance between the rows of terminals of the circuit pack to be mounted. The proper spacing of the rows of apertures and slots is adjusted in a second fabrication step in which the two side walls of the housing are urged together to close the base gap thereby bringing the rows of apertures and slots into conformity with the circuit pack terminal spacings. The two sections of the base are locked together by latches provided at each end of the housing, which latches are also integrally molded therewith.

It will be appreciated that as the distance between the parallel side walls is decreased as described in the foregoing, distortion of the housing top must follow. Advantageously, in accordance with an important aspect of this invention, this distortion is controlled by parallel grooves molded into the housing top acting as hinge lines to cause the top to be folded upward in a triangular, peaked roof fashion. Two parallel lever members are thus formed in the housing top, the bases of which lie generally along the rows of apertures. Near the base of each of the lever members and running lengthwise therewith within the cavity housing, is a slot adapted to engage an extension of one blade of a two-blade contact receptacle between which blades a terminal of a circuit pack is inserted. When the contact receptacles are fitted in the slots provided therefor in the base, the blades are thus held open in preparation for the insertion of the circuit pack terminals after the housing electrical contact receptacles are suitably connected to a printed wiring board.

Assuming such a wiring board connection, the terminals of a circuit pack, such as a dual-in-line pack, may now be inserted in the housing apertures provided therefor. Since the blades of the contact receptacles are held spread apart by the housing top lever members, the circuit pack terminals are freely admitted and encounter only possibly negligible resistance if incidental sliding contact is made with the aperture walls. As the insertion of the terminals continues, the body of the circuit pack ultimately makes contact with the peak of the housing top, e.g., at the juncture of the two top lever members. At this point, a slight downward thrust of the pack snaps the two lever members downward beyond the horizontal to a final position as permitted by the resilience of the housing side walls. At this final position, the lever members force the engaged blades of the contact receptacles firmly against the circuit pack terminals for positive electrical contact. The lever members are locked in their downward positions by latching means also integrally molded with the connector housing. The circuit pack terminals may be released by simply disengaging the latter latching means and snapping the lever members back to their peaked positions.

BRIEF DESCRIPTION OF THE DRAWING

The features of a zero insertion force socket connector according to this invention will be better understood from a consideration of the detailed description of the organization and operation of one illustrative embodiment thereof which follows when taken in conjunction with the accompanying drawing in which.

DETAILED DESCRIPTION

Figure 1:
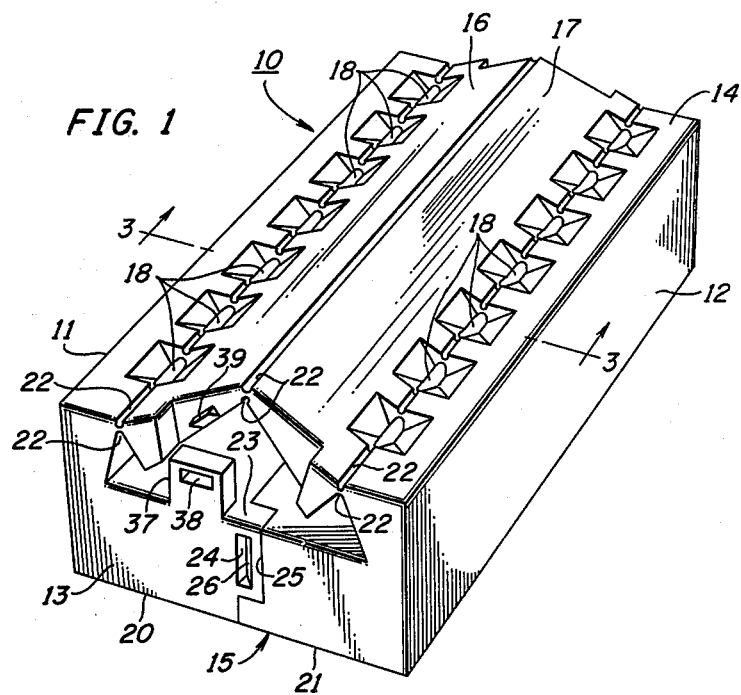
FIG. 1 is a perspective view of an illustrative socket connector housing according to this invention shown in its latched together state.

The general external configuration of one illustrative zero insertion force connector 10 according to this invention is shown in perspective view in FIG. 1 in its ready for use state, its internal contact receptacles not being visible in the figure. Connector 10 is molded of an electrically insulating, relatively resilient, plastic material of a character well-known in the art and is formed to present a pair of parallel side walls 11 and 12, a pair of end walls, one of which, wall 13, is visible in the figure, a top wall 14, and a base 15. Top wall 14, in the final configuration of FIG. 1, is centrally raised to present, in peaked-roof fashion, a pair of elongated members 16 and 17 running parallel with side walls 11 and 12. Top wall 14 is provided with a double row of apertures 18 aligned along the bases of members 16 and 17 and evenly spaced to receive the terminals of an integrated circuit pack to be considered hereinafter. To facilitate the entry of the latter terminals, which typically are rectangular in cross-section, apertures 18 are conventionally chamfered at the surface of top wall 14.

Figure 2:
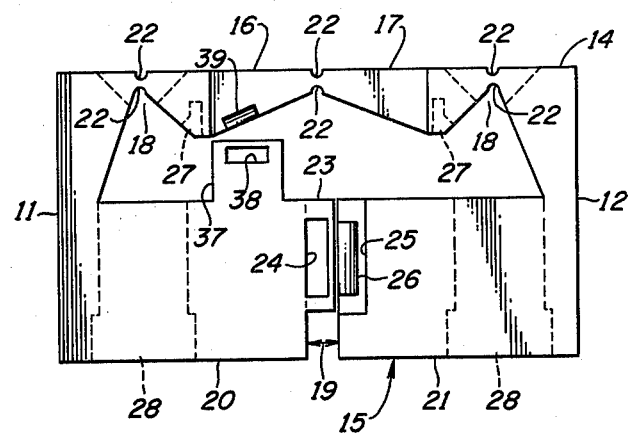
FIG. 2 is a slightly enlarged end view of the housing of FIG. 1 shown in its initial state immediately after its molding and before being locked in its assembled state.

As mentioned hereinbefore, the connector housing as depicted in FIG. 1 is shown in its final locked-together state. Its prior state, immediately following its molding, may be seen in the end view of FIG. 2 which view also more clearly shows other details of the connector construction including its internal cavity. The further details may also be more clearly understood in the cross-section views of FIGS. 3 and 4 to which reference will also be made in the following description. As shown in FIG. 2, the top wall 14 of the connector housing 10 is initially flat with the surface of members 16 and 17 lying in the same plane. This results from the fact that, initially, the side walls 11 and 12 are spaced apart a distance greater than that separating these walls in their final housing state by a small increment equal to the gap 19 separating the base 15 into two equal sections 20 and 21. To achieve the final housing form as shown in FIG. 1, the side walls 11 and 12 are manually or otherwise urged toward each other to close gap 19. As made possible by the resiliency of the plastic housing walls, the members 16 and 17 are forced upward as a result to achieve the peaked surface of top wall 14. In order to facilitate the upward folding of top wall members 16 and 17 and to ensure their accurate formation, hinge lines are delineated on the top wall 14 and on the upper surface of the housing cavity in the form of molded grooves 22 running parallel with the side walls 11 and 12.

The connector housing structure is locked into its final state by a latch mechanism formed in each end wall as shown in the various figures as, for example, in FIG. 2. Section 20 of base 15 has molded thereon a lug 23 having provided therein a slot 24. Lug 23 is dimensioned and adapted to fit a notch 25 molded into section 21 of base 15. Within notch 25 is formed a barb 26, conveniently of triangular cross-section, which barb 26 is adapted to engage the right wall, as viewed in the drawing, of slot 24, as the two base sections 20 and 21 are brought into abutment. The engaged position of the latching mechanism as just described is clearly shown in FIG. 1 and other figures of the drawing. A second latching mechanism is also formed at each end wall 13 of connector housing 10, which second mechanism will be considered in detail hereinafter. It will be appreciated that in its initial state, the rows of apertures 18 in the top wall 14 of housing 10 were spaced apart a greater distance than the rows of circuit pack terminals to be received by an increment equal to base 15 gap 19. With the closing together of side walls 11 and 12, the rows of apertures 18 are also brought into the proper spacing.

Figure 3:
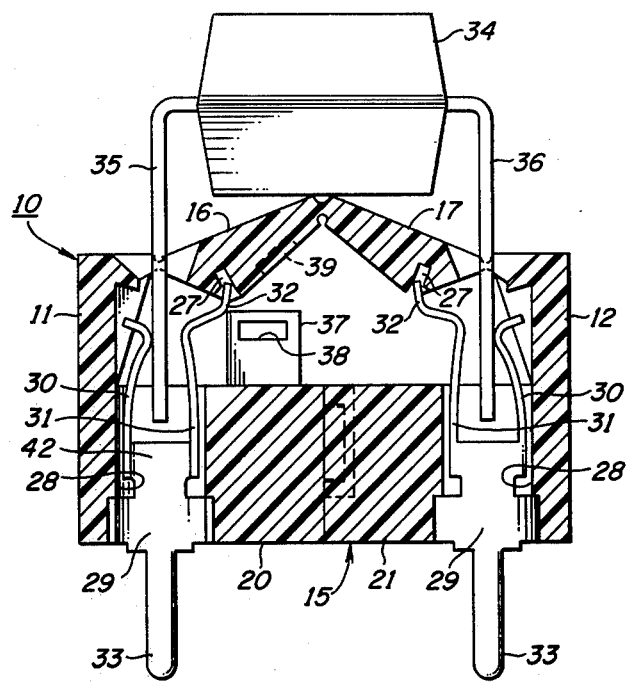
FIG. 3 is a cross-section end view of the connector housing of FIG. 1 taken along the line 3-3 showing an end view of an integrated circuit pack in position immediately prior to its final insertion in the connector.
Figure 4:
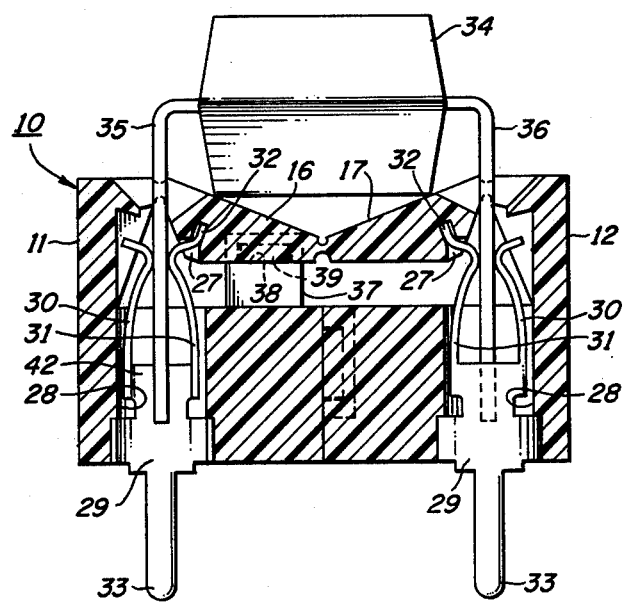
FIG. 4 depicts the same cross-section view of the connector housing of FIG. 1 as that of FIG. 3 with the exception that the integrated circuit pack is shown in association therewith in its final "snapped-in" position.

To make possible the unitary molding of the connector housing 10, the elongated "roof" members 16 and 17 are inset at each end to provide clearance for the second latching mechanism mentioned hereinbefore. Each of the members 16 and 17 has formed on its inner surface and near its base hinge line, an inwardly facing rectangular slot 27 running parallel with side walls 11 and 12. Slots 27 are shown in hidden view and more clearly in FIGS. 3 and 4. The function of slots 27 and the final assembly of the connector so far described may now be considered, which assembly comprises the fitting therein of electrical contact receptacles. As shown in hidden view in FIG. 2 and more clearly in the cross-section views of FIGS. 3 and 4, each of the sections 20 and 21 of base 15 of the connector housing 10 has molded therein a row of rectangular slots 28 aligned and spaced to correspond with the apertures 18 in the top wall 14. Slots 28 are each dimensioned and shouldered to have frictionally fitted therein an electrical contact receptacle 29 (FIGS. 3 and 4). A receptacle 29 generally comprises a pair of blades 30 and 31, which when suitably spaced apart are adapted to clasp therebetween by spring action a terminal of a circuit pack. The blades 30 and 31 are perpendicularly raised from and are supported by a base 42 in what is thus a generally "U" shaped construction. This construction, viewed from its open side in FIG. 3, is continued with a slight widening of base 42 at which a pair of flanges are upturned from the base to fit a shouldered slot 28 of base 15. Receptacle 29 extends externally from housing 10 to present a terminal 33 which is provided for permanent soldering to a wiring board with which the connector of the invention is adapted for use. Terminal 33 might also be configured as a solderless wire wrap terminal for non-soldered applications. Returning to the contact blades 30 and 31 of receptacle 29, blade 30 is seen to curve slightly inwardly toward its contact point with a pack terminal after which it flares slightly outwardly. Blade 31 is similarly curved and then flared outwardly. The flared portion of blade 31, however, is extended to present a detent 32 adapted to engage slot 27 of the member 16 of the top wall of connector housing 10. As so engaged, and before the final insertion of an integrated circuit pack, the upward position of member 16 maintains blade 31 clear of a terminal inserted between blades 30 and 31.

Each of the other slots 28 of base section 20 has a contact receptacle identical to receptacle 29 fitted therein, each having a detent portion on its inner blade in engagement with slot 27 of top member 16. In a similar manner, each of the slots 28 of base section 21 has a contact receptacle 29 fitted therein, although reversed in position, to bring its detent portion 32 into engagement with slot 27 of top member 17. With the organization of a connector according to this invention so far described in mind, an illustrative operation as a socket for a circuit pack may now be considered. Although the connector is shown in the drawing as a separate and distinct entity, in practice the terminals 33 will be understood as being permanently soldered to predetermined points on the wiring of a printed wiring board. Referring specifically to FIG. 3, an integrated circuit pack 34 (end view) is shown in position after partial insertion of its terminals, represented by two opposing terminals 35 and 36, between blades 30 and 31 of opposite contact receptacles 29 of the connector. The other terminals on either side of circuit pack 34, not visible in the figure, are assumed as also being so positioned between corresponding receptacle blades. At this point, the base of circuit pack 34 is just in contact with the peaked juncture of members 16 and 17 and blades 30 are in slight contact with the outer sides of terminals 35 and 36. As circuit pack 34 is urged further downwardly and a force is exerted at the peaked juncture of members 16 and 17, the bases of the latter members are forced laterally outward against the plastic resiliency of side walls 11 and 12. As the downward movement of the members 16 and 17 continues, detents 32 of blades 31 urge the latter blades and their curved contact portions toward the inner sides of terminals 35 and 36. This action continues as the upper surfaces of members 16 and 17 approach and pass the horizontal. At this point, the spring action of side walls 11 and 12 exceeds its limit and, as the latter walls restore to their original perpendicular positions, members 16 and 17 are snapped downwardly in a reverse peak state. The resulting operative state of the connector is shown in the section view of FIG. 4 where the final state of members 16 and 17 in their functions as elongated levers is also clear. In the final state of the latter members, detents 32 are forced into their final outward state, forcing the contact areas of blades 31 into firm electrical contact with the inner sides of terminals 35 and 36. The lever action of members 16 and 17 is sufficient to cause a slight outward movement of terminals 35 and 36 to ensure their further positive contact with blades 30 against the spring action of the latter contact blades.

Members 16 and 17, although maintained in their downward positions by the spring action of side walls 11 and 12, are locked in that position by a second locking mechanism also shown in FIGS. 1 and 2. Base 15 of connector housing 10 is provided at each end on its section 20 with an upwardly extending lug 37 having a horizontal slot 38 therein. Extending outwardly from and molded integrally with each end of top members 16 is a detent 39 adapted to engage the upper inner surface of slot 38 when member 16 (and member 17) is in its downward position. The locking mechanism is readily disengaged by prying out detent 39 against the spring action of lug 37. At that time, members 16 and 17 may be pried upward, which members by lever action, as a result, move the blades 31 out of contact with terminals 35 and 36. Since all clasping forces are thus removed, circuit pack 34 and its terminals may now be freely withdrawn from the connector. It will be appreciated that although the illustrative connector as shown in the drawing is provided with a specific number of terminal sockets, the invention is not so limited and housing 10 may be constructed to accommodate any lesser or greater number of circuit pack terminals.

What has been described is considered to be only one specific connector construction according to the principles of this invention and it is to be understood that various and numerous other arrangements may be devised by one skilled in the art without departing from its spirit and scope as defined by the accompanying claims.

What is claimed is:

1. An electrical socket connector construction for receiving the terminals of an electrical circuit pack, said construction comprising an electrically insulative, rectangular housing having a top wall, two side walls and a base, said top wall having two parallel rows of apertures parallelly arranged with said side walls and dimensioned to freely admit said terminals, and a plurality of two-bladed contact receptacles fitted into said base in respective alignment with said apertures, characterized in that said top wall is peaked upwardly to present a pair of elongated lever members between said rows of apertures, each of said members has provided on the inner surface near its base, a pawl means running parallel with said side walls, one blade of each of said plurality of contact receptacles is extended to present a detent adapted to engage said pawl means for maintaining said blades open to admit said terminals, and in that said members are adapted to be rotated downwardly by the insertion of said circuit pack to close said one blade of each of said plurality of receptacles on a corresponding one of said terminals.

2. An electrical socket connector construction as claimed in claim 1 characterized in that latching means are provided at each end of one of said lever members for locking said members downward.

3. An electrical socket connector construction for receiving the terminals of an electrical circuit pack, said construction comprising an electrically insulative, rectangular housing having a top wall, a side wall, and a base, said top wall having a row of apertures parallelly arranged with said side wall and dimensioned to freely admit said terminals, and a plurality of two-bladed contact receptacles fitted into said base in respective alignment with said apertures characterized in that said top wall is turned upward to present an elongated lever member, said member has provided on its inner surface near its base, pawl means running parallel with said side wall, one blade of each of said plurality of contact receptacles is extended to present a detent adapted to engage said pawl means for maintaining said blades open to admit said terminals and in that said member is adapted to be rotated downwardly by the insertion of said circuit pack to close said one blade of each of said plurality of receptacles on a corresponding one of said terminals.

4. An electrical socket connector construction as claimed in claim 3, characterized in that latching means are provided at least at one end of said member for locking said member downward.

5. An electrical socket connector construction for receiving a pair of terminals of an electrical component, said construction comprising an electrically insulative housing having a top wall, two side walls and a base, said top wall having a pair of apertures dimensioned to freely admit said terminals, and a pair of two-bladed contact receptacles fitted into said base in respective alignment with said apertures, characterized in that said top wall is peaked upwardly to present a pair of lever members between said pair of apertures, each of said members has provided on the inner surface near its base, a pawl means, one blade of each of said pair of contact receptacles is extended to present a detent adapted to engage said pawl means for maintaining said blades open to admit said terminals, and in that said members are adapted to be rotated downwardly by the insertion of said electrical component to close said one blade of each of said pair of receptacles on a corresponding one of said terminals.

6. An electrical socket connector construction as claimed in claim 5, characterized in that latching means are provided on one of said members for locking said member downward.

7. An electrical socket connector construction for receiving an electrical terminal, said construction comprising an electrically insulative, rectangular housing having a top wall, a side wall, and a base, said top wall having an aperture dimensioned to freely admit said terminal, and a two-bladed contact receptacle fitted into said base in respective alignment with said aperture, characterized in that said top wall is peaked upwardly to present a lever member, said member has provided on the inner surface near its base pawl means, one blade of said contact receptacle is extended to present a detent adapted to engage said pawl means for maintaining said blades open to admit said terminal, and in that said member is adapted to be rotated downwardly by the insertion of said terminal to close said one blade on said terminal.

8. An electrical socket connector construction as claimed in claim 7 characterized in that latching means are provided on said member for locking said member downward.

9. An electrical housing having side walls, and initially planar top wall, and a base, said top wall having apertures for admitting electrical component terminals and said base having sockets for receiving electrical contact receptacles having open and contact states, characterized in that said base is formed in two sections separated by a gap, and in that said top wall has a pair of lever members defined thereon, said lever members being raisable upwardly from the planar when said base sections are closed together for controlling said open receptacle states and being moveable downwardly from the planar for controlling said contact receptacle states.

10. An electrical connector housing having side walls, an initially planar top wall, and a base, said top wall having first and second parallel rows of apertures therein for admitting the terminals of an electrical component and said base having first and second rows of corresponding sockets for receiving electrical contact receptacles having open and contact states, characterized in that said base is formed in two sections separated by a gap, said top wall has a pair of lever members defined thereon between said first and second rows of apertures, said lever members being raisable upwardly from the planar when said base sections are closed together and being moveable downwardly from the planar, and in that said lever members have pawl means formed thereon for controlling said open and contact states of said receptacles.

11. An electrical connector housing having side walls an initially planar top wall, and a base, said top wall having a first and a second aperture therein for admitting the terminals of an electrical component and said base having a first and second socket for receiving electrical contact receptacles having open and contact states, characterized in that said base is formed in two sections separated by a gap, said top wall has a pair of lever members defined thereon between said first and second apertures, said lever members being foldable upwardly from the planar along a common hinge line and along base hinge lines when said base sections are closed together and being foldable downwardly from the planar along said hinge lines, and in that said lever members have pawl means formed thereon for controlling said open and contact states of said receptacles.

12. An electrical connector housing as claimed in claim 9, 10, or 11, characterized in that a latch means is provided integrally with said base sections for locking said sections together.

13. An electrical connector housing as claimed in claim 12 characterized in that a latch means is provided integrally with said base and one of said members for locking said members downwardly.

* * * * *

UNITED STATES PATENT AND TRADEMARK OFFICE
CERTIFICATE OF CORRECTION

PATENT NO. : 4,189,199
DATED : February 19, 1980
INVENTOR(S) : Thomas G. Grau

It is certified that error appears in the above-identified patent and that said Letters Patent are hereby corrected as shown below:

In the claims, Column 8, claim 9, line 5, after "electrical" insert --connector--.

Signed and Sealed this

Second Day of November 1982

[SEAL]

Attest:

GERALD J. MOSSINGHOFF

Attesting Officer    Commissioner of Patents and Trademarks